United States Patent
Lu et al.

(10) Patent No.: US 10,122,357 B2
(45) Date of Patent: Nov. 6, 2018

(54) SENSORLESS TEMPERATURE COMPENSATION FOR POWER SWITCHING DEVICES

(71) Applicant: FORD GLOBAL TECHNOLOGIES, LLC, Dearborn, MI (US)

(72) Inventors: Xi Lu, Northville, MI (US); Chingchi Chen, Ann Arbor, MI (US); Michael W. Degner, Novi, MI (US); Zhuxian Xu, Novi, MI (US); Ke Zou, Canton, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 15/350,278

(22) Filed: Nov. 14, 2016

(65) Prior Publication Data
US 2018/0138902 A1    May 17, 2018

(51) Int. Cl.
*H03K 17/14*    (2006.01)
*H03K 17/567*    (2006.01)
(Continued)

(52) U.S. Cl.
CPC .......... *H03K 17/14* (2013.01); *B60L 11/1803* (2013.01); *H01L 24/49* (2013.01);
(Continued)

(58) Field of Classification Search
CPC ...... H02P 2209/07; H02P 6/182; H02P 27/08; H02P 3/18; H02P 6/10; H02P 6/20;
(Continued)

(56) References Cited

U.S. PATENT DOCUMENTS

| | | | | |
|---|---|---|---|---|
| 4,297,655 A | * | 10/1981 | Fujii | H03L 1/023 331/116 R |
| 5,546,295 A | * | 8/1996 | Prete | H02M 3/337 363/17 |

(Continued)

FOREIGN PATENT DOCUMENTS

| | | |
|---|---|---|
| JP | H0722515 A | 1/1995 |
| JP | 2003319638 A | 11/2003 |

(Continued)

OTHER PUBLICATIONS

Electronic Components and Materials—Extraction of Parasitic Capacitance for Multilayer Chip Ceramic Inductor Vo. No. Aug. 2010.*

(Continued)

*Primary Examiner* — Bentsu Ro
(74) *Attorney, Agent, or Firm* — David B. Kelley; MacMillan, Sobanski & Todd, LLC

(57) ABSTRACT

An inverter for an electric vehicle drive has a bridge including a plurality of power switching devices having respective insulated gate terminals and emitter terminals. A PWM circuit determines switching commands for controlling the bridge. A plurality of gate drivers receive the switching commands and provide gate drive signals to respective gate terminals. A plurality of gate capacitors are each thermally coupled to a respective switching device and are electrically connected between the respective gate and emitter terminals. Each gate capacitor has a negative temperature coefficient adapted to counter changes in a switching speed of the switching devices over a predetermined range of temperature. As a result, a consistent switching speed is maintained so that power loss and switching device reliability are optimal across the full temperature range.

12 Claims, 4 Drawing Sheets

(51) Int. Cl.
  *H01L 25/07* (2006.01)
  *H01L 23/00* (2006.01)
  *H02P 27/08* (2006.01)
  *B60L 11/18* (2006.01)

(52) U.S. Cl.
  CPC ............ *H01L 25/072* (2013.01); *H02P 27/08* (2013.01); *H03K 17/567* (2013.01); *H01L 2224/48265* (2013.01); *H01L 2924/13055* (2013.01); *H01L 2924/19041* (2013.01); *H01L 2924/19043* (2013.01); *H01L 2924/19104* (2013.01)

(58) Field of Classification Search
  CPC ........... H03K 17/168; H03K 17/04123; H03K 17/162; H03K 17/165; H03K 17/567; H03K 17/04106; H03K 17/042; H03K 17/0814
  USPC .................... 318/400.26, 471–473, 479, 504
  See application file for complete search history.

(56) References Cited

U.S. PATENT DOCUMENTS

| | | | |
|---|---|---|---|
| 5,909,108 A | 6/1999 | He et al. | |
| 6,124,751 A * | 9/2000 | Pidutti | G11B 5/022 327/110 |
| 6,153,495 A * | 11/2000 | Kub | H01L 21/187 257/E21.054 |
| 6,215,634 B1 * | 4/2001 | Terasawa | H02M 3/33592 327/310 |
| 6,275,399 B1 * | 8/2001 | Miyazaki | H03K 17/0822 363/132 |
| 6,384,552 B2 | 5/2002 | Shimane | B60L 11/1803 318/139 |
| 6,759,728 B1 * | 7/2004 | Pidutti | G11B 5/022 257/296 |
| 6,892,152 B2 * | 5/2005 | Ramillon | G01H 1/06 367/13 |
| 6,995,994 B2 * | 2/2006 | Bijlenga | H02M 7/4826 363/51 |
| 7,138,321 B2 * | 11/2006 | Pidutti | G11B 5/022 257/299 |
| 7,141,832 B2 * | 11/2006 | Sugiyama | H01L 23/49844 257/133 |
| 7,145,201 B2 | 12/2006 | Pfirsch | |
| 7,256,564 B2 * | 8/2007 | MacKay | H02P 6/182 318/268 |
| 7,279,860 B2 * | 10/2007 | MacKay | H02P 6/10 318/400.34 |
| 7,288,911 B2 * | 10/2007 | MacKay | H02P 6/182 318/400.21 |
| 7,477,034 B2 * | 1/2009 | MacKay | H02P 6/182 318/254.1 |
| 7,592,761 B2 * | 9/2009 | MacKay | H02P 6/20 318/254.1 |
| 7,639,061 B2 * | 12/2009 | Sugiyama | H01L 23/49844 327/374 |
| 7,948,276 B2 * | 5/2011 | Nilson | H03K 17/0828 326/21 |
| 7,974,070 B2 | 7/2011 | Togashi | |
| 8,183,806 B2 * | 5/2012 | Nolan | H02P 6/182 318/400.34 |
| 8,299,739 B2 * | 10/2012 | Kakebayashi | H02P 3/18 318/139 |
| 8,310,796 B2 | 11/2012 | Wagoner | |
| 8,420,987 B2 | 4/2013 | Kim et al. | |
| 8,471,622 B2 * | 6/2013 | Ishikawa | H03K 17/08128 327/108 |
| 8,847,631 B2 * | 9/2014 | Tao | H03K 17/04123 327/108 |
| 2001/0030880 A1 * | 10/2001 | Miyazaki | H03K 17/0822 363/98 |
| 2002/0080551 A1 * | 6/2002 | Kitagawa | H01G 4/20 361/302 |
| 2003/0107905 A1 * | 6/2003 | Miura | H01L 29/7803 363/41 |
| 2004/0041201 A1 * | 3/2004 | Sugiyama | H01L 23/49844 257/316 |
| 2004/0061990 A1 * | 4/2004 | Dougherty | H01L 27/0805 361/272 |
| 2004/0213072 A1 * | 10/2004 | Pidutti | G11B 5/022 365/232 |
| 2004/0240240 A1 * | 12/2004 | Bijlenga | H02M 7/4826 363/56.12 |
| 2005/0194660 A1 | 9/2005 | Mochizuki et al. | |
| 2007/0040184 A1 * | 2/2007 | Sugiyama | H01L 23/49844 257/133 |
| 2007/0040185 A1 * | 2/2007 | Sugiyama | H01L 23/49844 257/133 |
| 2007/0069668 A1 * | 3/2007 | MacKay | H02P 6/10 318/400.34 |
| 2007/0069669 A1 * | 3/2007 | MacKay | H02P 6/20 318/400.12 |
| 2007/0069675 A1 * | 3/2007 | MacKay | H02P 6/182 318/400.21 |
| 2007/0069676 A1 * | 3/2007 | MacKay | H02P 6/182 318/400.11 |
| 2007/0069677 A1 * | 3/2007 | MacKay | H02P 6/182 318/400.27 |
| 2010/0141188 A1 * | 6/2010 | Kakebayashi | H02P 3/18 318/400.3 |
| 2010/0148830 A1 * | 6/2010 | Nilson | H03K 17/0828 327/108 |
| 2010/0308758 A1 * | 12/2010 | Nolan | H02P 6/182 318/400.04 |
| 2013/0154711 A1 * | 6/2013 | Kuttenkuler | H03K 17/08128 327/326 |
| 2013/0162322 A1 * | 6/2013 | Tao | H03K 17/04123 327/381 |
| 2013/0258736 A1 * | 10/2013 | Higuchi | H01L 25/072 363/131 |
| 2014/0307495 A1 * | 10/2014 | Fukuta | H02H 3/08 363/98 |
| 2015/0123715 A1 * | 5/2015 | Butow | H02M 1/08 327/109 |
| 2015/0131350 A1 * | 5/2015 | Isomura | H02M 1/38 363/131 |
| 2015/0381166 A1 * | 12/2015 | Kittila | H03K 17/0812 327/109 |
| 2016/0308523 A1 * | 10/2016 | Otake | H03K 17/162 |
| 2017/0194954 A1 * | 7/2017 | Chen | H03K 17/0826 |

FOREIGN PATENT DOCUMENTS

| | | |
|---|---|---|
| JP | 4024531 B2 | 10/2007 |
| JP | 2008042317 A | 2/2008 |
| JP | 2008099359 A | 4/2008 |
| JP | 4802499 B2 | 8/2011 |

OTHER PUBLICATIONS

Technical Information—Parasitic Inductance of Multilayer Ceramic Capacitors, 2012.*

Ichikawa et al, Modules for Hybrid Vehicle Motor Driving, Fuji Electric Review, vol. 55, No. 2, pp. 46-50, 2009.

* cited by examiner

SENSORLESS TEMPERATURE COMPENSATION FOR POWER SWITCHING DEVICES

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to the control of switching transients for power switching transistors, and, more specifically, to providing automatic temperature-compensation to maintain desirable switching speeds for insulated gate transistors for power converters of a type used in electrified vehicles.

Electrified vehicles, such as hybrid electric vehicles (HEVs), plug-in hybrid electric vehicles (PHEVs), and battery electric vehicles (BEVs), use inverter-driven electric machines to provide traction torque. A typical electric drive system includes a DC power source (such as a battery pack or a fuel cell) coupled by contactor switches to a variable voltage converter (VVC) to regulate a main bus voltage across a main DC link capacitor. An inverter is connected between the main buses and a traction motor in order to convert the DC power to an AC power that is coupled to the windings of the motor to propel the vehicle.

The inverter includes transistor switching devices (such as insulated gate bipolar transistors, or IGBTs) connected in a bridge configuration including a plurality of phase legs. A typical configuration includes a three-phase motor driven by an inverter with three phase legs. An electronic controller turns the switches on and off in order to invert a DC voltage from the bus to an AC voltage applied to the motor. The inverter is controlled in response to various sensed conditions including the rotational position of the electric machine and the current flow in each of the phases.

The inverter for the motor may preferably pulse-width modulate the DC link voltage in order to deliver an approximation of a sinusoidal current output to drive the motor at a desired speed and torque. Pulse Width Modulation (PWM) control signals are applied to drive the gates of the IGBTs in order to turn them on and off as necessary. In an idealized form, the gate drive control signals are square wave signals that alternate each power switching device (e.g., IGBT) between a fully off and a fully on (saturated) state. During turn off and turn on, it takes time for the device to respond to the change in the gate drive signal. For example, after the gate drive signal transitions from a turn-off state to a turn-on state, conduction through the device output transitions from zero current flow to a maximum current flow within a few microseconds. Switching speed or time depends on the slope of the current change (di/dt) and the voltage change (dv/dt) as determined by characteristics of the switching device and its associated circuitry, including the gate driver.

The optimal switching speed of a power semiconductor transistor device is a tradeoff between high stresses which could reduce reliability at very fast switching speeds versus reduced efficiency and increased power losses at slower switching speeds. With variations in the operating temperature of the transistor, however, the switching speed changes in response to certain temperature-sensitive parameters of the transistor including internal gate resistance, threshold voltage, and trans-conductance. Generally, as temperature increases the switching speed decreases, so that switching losses increase; and as temperature decreases the voltage stress increases while the breakdown voltage decreases, which could impact reliability.

In order to ensure reliable operation across a full range of operational temperatures, one conventional approach has been to select an optimal gate control signal trajectory or slope (e.g., as determined by the gate resistance or similar control parameters) and then configure a gate driver and the auxiliary circuitry of the transistor device to achieve the optimal slope at the lowest operating temperature. For example, the voltage of the gate drive signals and/or the resistance of a gate resistor coupling a gate driver to the gate terminal of the transistor device can be configured to determine a target switching performance, whereby the minimum acceptable switching time is set to occur at the worst case temperature. Although power losses increase as temperature rises above the lowest temperature, excessive stress is avoided at all temperatures.

To avoid both excessive stress and lowered efficiency, it is possible to actively compensate for the temperature-induced parameter changes. Therefore, compensatory measures have been taken that can shorten the switching time when increases in temperature slow down the switching speed of the transistor. For example, the switching speed has been increased by increasing the magnitude and/or slope of the current being supplied to the gate by the gate drive signal in proportion to the temperature increase. It is known to vary the gate current directly by using a controllable current source for the gate driver, or by manipulating the gate current indirectly by increasing the gate voltage or gradually decreasing the gate resistance. The parameters have been adjusted 1) using a closed-loop control system based on a measured temperature, and 2) automatically by incorporating a negative-temperature coefficient (NTC) resistance connected to the gate, for example. A closed loop control system, however, requires extra components and increases cost and complexity. An NTC resistor (e.g., thermistor) is also relatively expensive and bulky. It would be desirable to obtain automatic switching speed compensation at a lower cost and with reduced space requirements.

SUMMARY OF THE INVENTION

The present invention provides automatic compensation by adding a discrete capacitive element to the transistor gate circuit (sharing the same temperature with the transistor device) which has a negative temperature coefficient, wherein the circuit parameters are optimized at the most likely operating temperature so as to automatically compensate for the switching speed slowing down at higher temperatures and speeding up at lower temperatures (i.e., without a requirement for feedback from a temperature sensor). The NTC characteristics of an NTC capacitor can be achieved using small, space-saving devices having a low cost. Furthermore, the use of an NTC capacitor enables the use of a smaller resistance for the gate resistor, leading to other potential cost savings in the gate drivers.

In one aspect of the invention, an inverter for an electric vehicle drive comprises a bridge including a plurality of power switching devices having respective insulated gate terminals and emitter terminals. A PWM circuit determines switching commands for controlling the bridge. A plurality of gate drivers receive the switching commands and provide gate drive signals to respective gate terminals. A plurality of gate capacitors are each thermally coupled to a respective switching device and are electrically connected between the respective gate and emitter terminals. Each gate capacitor has a negative temperature coefficient adapted to counter changes in a switching speed of the switching devices over a predetermined range of temperature.

DETAILED DESCRIPTION OF PREFERRED EMBODIMENTS

Figure 1:
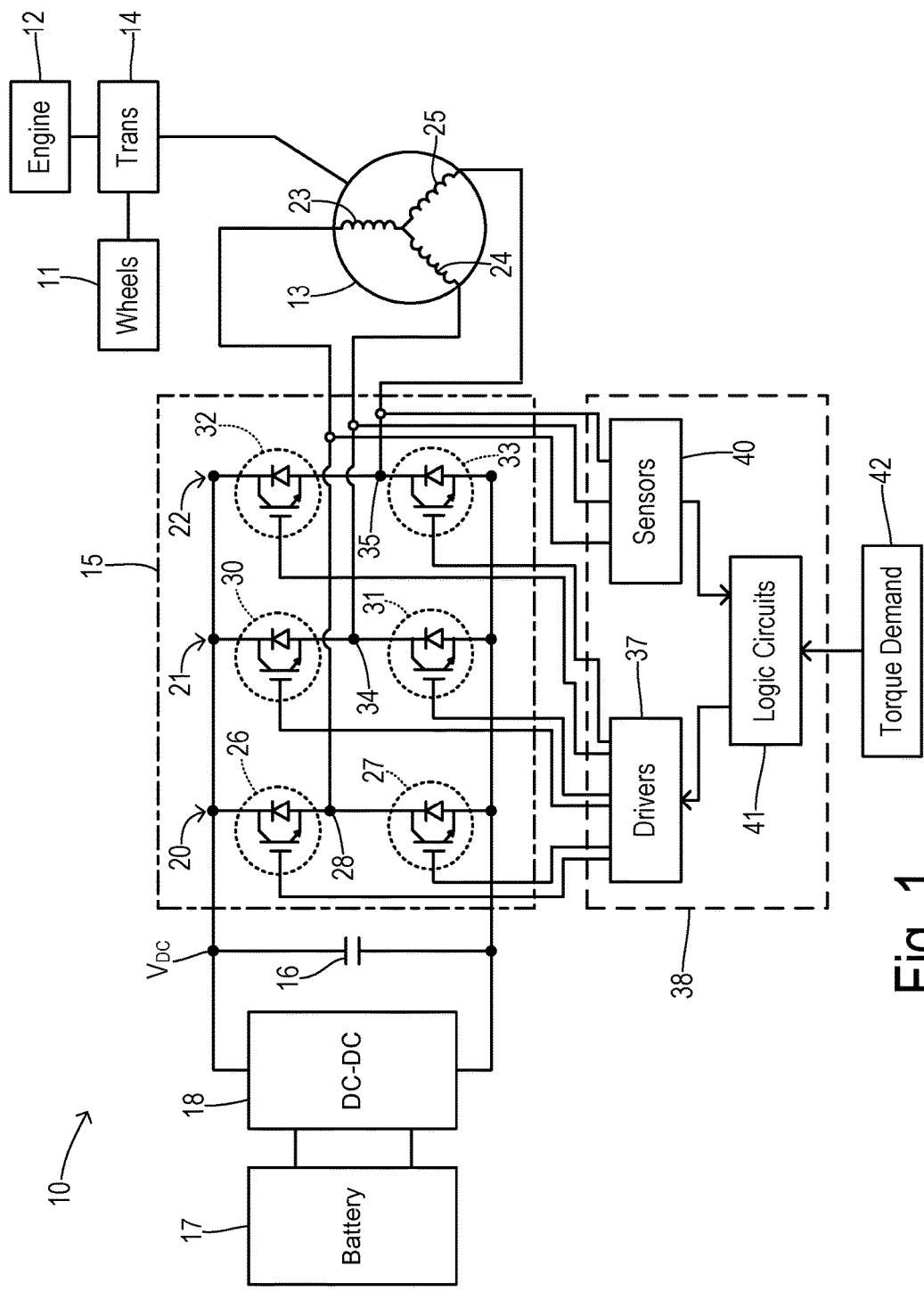
FIG. 1 is a schematic, block diagram showing a powertrain of an electrified vehicle according to one embodiment of the present invention.

FIG. 1 shows a hybrid electric vehicle 10 wherein vehicle wheels 11 may be driven by an internal combustion engine 12 and/or by a traction motor 13 via a transmission 14. For providing electric propulsion, motor 13 may be driven via an inverter switching bridge 15 that receives a DC link voltage at a DC link capacitor 16. The DC link voltage may result from conversion of DC power from a battery pack 17 by a converter 18 as known in the art.

Inverter 15 includes phase legs 20, 21, and 22 coupled to motor phase windings 23, 24, and 25. Phase leg 20 has an upper switching device 26 and a lower switching device 27 connected across DC link 16 and providing a junction 28 between devices 26 and 27 which is connected to winding 23 of motor 13. Similarly, phase leg 21 his upper switching device 30 and lower switching device 31, while phase leg 22 has upper switching device 32 and lower switching device 33. Junctions 34 and 35 are coupled to motor windings 24 and 25, respectively.

The switching devices may be comprised of IGBTs, antiparallel diodes, wide band gap FETs, or other devices known in the art. Each of the upper and lower switching devices has a respective gate terminal coupled to drivers 37 in a controller 38. Current sensors 40 coupled to each of the junctions of the phase legs measure the current flow through each phase winding. Measured current magnitudes are provided from sensors 40 to logic circuits 41 in controller 38 for use in determining PWM switching signals to be applied to the switching devices by drivers 37. As known in the art, the measured current may be compared with a desired motor current as determined according to a torque demand 42 that may be derived from operator input such as an accelerator pedal so that the operator can control the vehicle speed. Thus, current feedback determines a PWM duty cycle within logic circuits 41 that is then used to generate the timing of PWM switching signals for the phase leg switching devices.

The timing of the PWM switching signals can be represented as a square wave voltage alternating between a turn-off voltage and a turn-on voltage for each respective switching device. Logic circuits 41 and/or drivers 37 further condition the switching signals to add dead-time intervals, calibrate the signals for the devices being used, and for other reasons.

Figure 2:
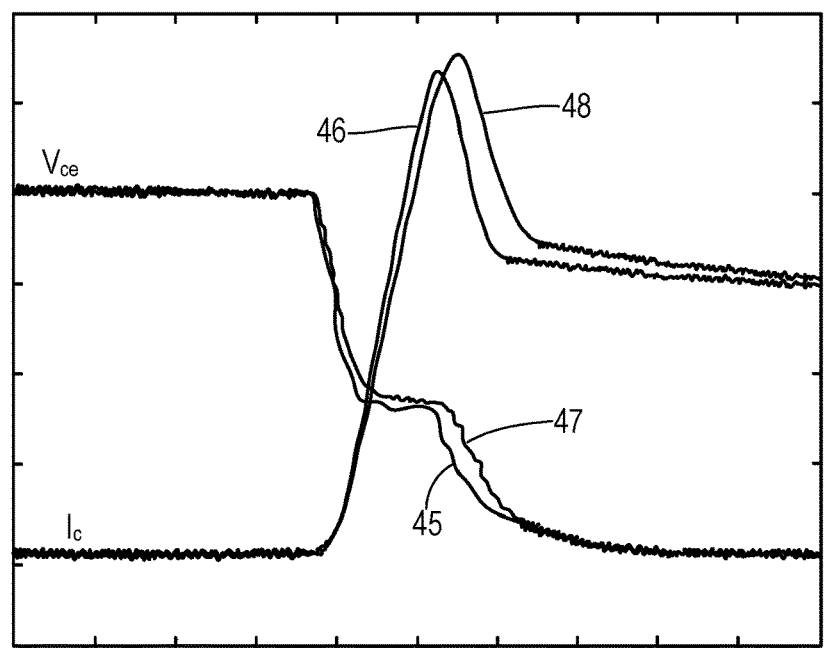
FIG. 2 shows switching times/waveforms for the turning on of a transistor device.
Figure 3:
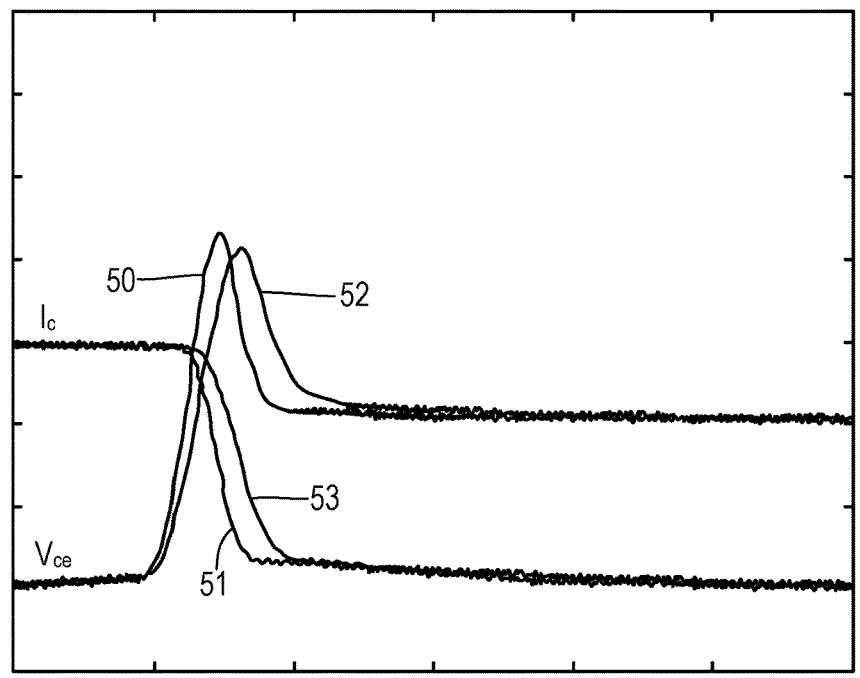
FIG. 3 shows switching times/waveforms for the turning off of a transistor device.

FIG. 2 represents output current and output voltage for a power switching device (e.g., an IGBT) when transitioning from a turn-off state to a turn-on state. While in the OFF state, the voltage across the device ($V_{CE}$) is high and the device current ($I_C$) is substantially zero. When the ON state is achieved, a positive load current is present and voltage $V_{CE}$ is very low. The switching time (i.e., turn-on time) could be defined as the time between the transition in the gate drive signal and stabilization of the output current, for example. Traces 45 and 46 are the output voltage and current, respectively, obtained at a first (lower) temperature, and traces 47 and 48 are the output voltage and current, respectively, obtained at a second (higher) temperature. As a consequence of the temperature increase, the switching time is increased, di/dt is decreased, and switching loss is increased. Similarly, FIG. 3 represents output current and output voltage for a power switching device when transitioning from a turn-on state to a turn-off state. Traces 50 and 51 are the output voltage and current, respectively, obtained at the first (lower) temperature, and traces 52 and 53 are the output voltage and current, respectively, obtained at the second (higher) temperature. As a consequence of the temperature increase, the switching time is once again increased, di/dt is decreased, and switching loss is increased.

Figure 4:
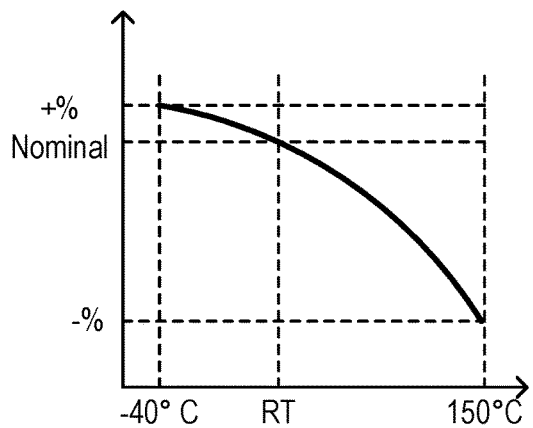
FIG. 4 is a temperature plot showing a negative temperature coefficient for a gate capacitor of one embodiment of the invention.

FIG. 4 shows a capacitance change (provided as a percentage) from a nominal (i.e., rated) capacitance value at room temperature. The plot covers a predetermined range of operating temperatures over which the inverter switching devices are required to perform, wherein the NTC capacitance has a value about 20% above the rated capacitance at −40° C. and a value about 80% below the rated capacitance at 150° C. A typical nominal capacitance value may be several tens of nF. A typical capacitance at 150° C. may be less than 1 nF.

An NTC capacitor can be constructed according to any known technology. One preferred type of NTC capacitor is a ceramic capacitor having multiple alternating layers of ceramic and metal. Ceramic capacitors are easily configured to provide a desired NTC characteristic. The NTC characteristic can be nonlinear (as in FIG. 4) using a Class 2 ceramic capacitor, or can be linear using a Class 1 ceramic capacitor in order to accurate counter the temperature-dependent switching time changes inherent in a particular power transistor device.

Figure 5:
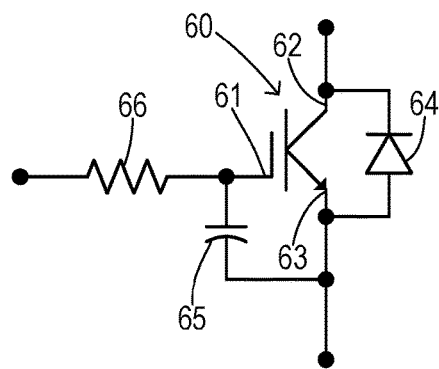
FIG. 5 is a circuit diagram showing a transistor and gate circuitry.

FIG. 5 shows a preferred embodiment of a switching device and support circuitry for automatically compensating for temperature-dependent switching times. An IGBT 60 has a gate terminal 61, a collector terminal 62, and an emitter terminal 63. An anti-parallel diode 64 is provided across the output of IGBT 60. An NTC capacitor 65 is electrically connected between gate terminal 61 and emitter terminal 63.

The effect of supplementing the gate-to-emitter capacitance is to slow down the IGBT switching time by an amount proportional to the added capacitance. A gate resistor 66 is connected in series with gate terminal 61 in order to supply a gate driver signal. In addition to the electrical connection, NTC capacitor 65 is thermally coupled to IGBT 60 in order to share substantially the same temperature.

Figure 6:
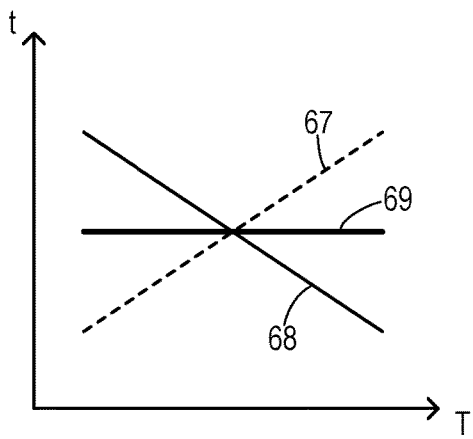
FIG. 6 is a diagram showing variation of transistor switching time over temperature being canceled by variation of capacitance of an NTC capacitor to obtain a substantially constant switching time.

In FIG. 6, a trace 67 shows an inherent switching time of a switching transistor which increases in proportion to temperature. A trace 68 shows an incremental switching time resulting from the added NTC capacitor, which is inversely proportional to temperature. The NTC capacitor is configured to specifically counter the changes inherent in the switching device, so that a combined switching time is substantially constant as shown by a trace 69. Consequently, a desired tradeoff simultaneously optimizing device stress and power loss can be maintained across the predetermined range of operating temperatures, while using a temperature-sensitive device having a low cost and needing only a small packaging space.

Figure 7:
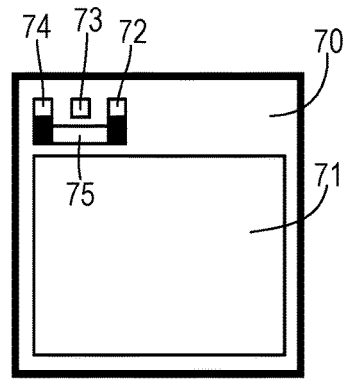
FIG. 7 is a plan view showing an NTC capacitor surface mounted on an inactive area of a semiconductor die for an IGBT.
Figure 8:
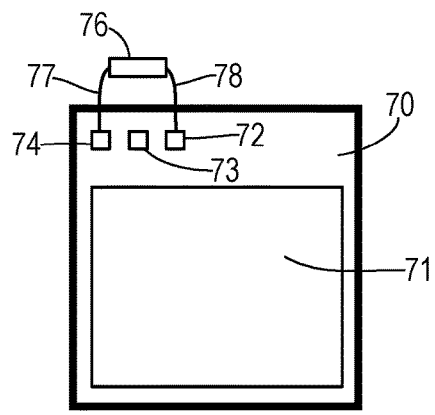
FIG. 8 is a plan view showing a discrete NTC capacitor connected to a semiconductor die for an IGBT via jumper wires.

FIG. 7 shows a plan view of a semiconductor die 70 of a typical power switching device such as an IGBT. An emitter 71 is provided on one side of die 70, and a collector (not shown) is located on the unseen side of die 70. A gate pad 72 and an emitter pad 74 are deployed on the emitter side of die 70. Another connector pad 73 may be provided for another function (e.g., current mirror or temperature sensing). A surface-mount NTC capacitor 75 is electrically connected between pads 72 and 74 (e.g., by surface mount soldering or poly silicon traces). The surface mounting of NTC capacitor 75 ensures a very good thermal coupling. In FIG. 8, a discrete NTC capacitor 76 is connected via jumper wires/bond wires 77 and 78 to emitter pad 74 and gate pad 72, respectively. Thus, NTC capacitor 76 shares the same direct bond copper (DBC) substrate with die 70 or is physically very close to die 70 for a good thermal coupling. If used, bond wires 77 and 78 are short in length in order to maintain the good thermal coupling.

Figure 9:
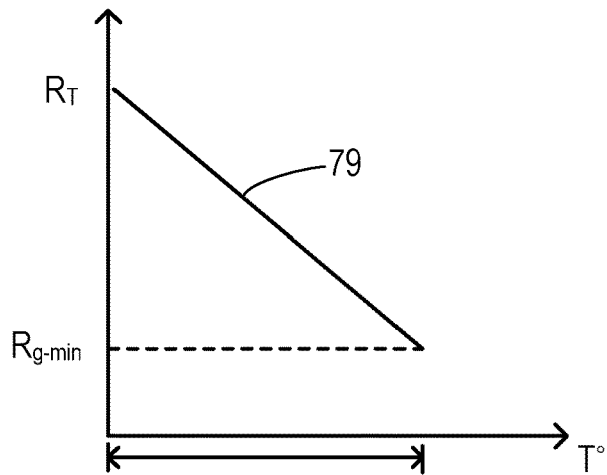
FIG. 9 is a graph comparing a gate resistance of the present invention with a gate resistance provided by a prior art thermistor.

Even using an NTC capacitor to obtain the desired temperature-dependent increases in switching time that are configured to specifically counter the changes inherent in the switching device, it is desirable to employ a gate resistor in series between the gate driver and the gate terminal. The gate resistor serves to 1) limit peak gate current to protect the output stage of the driver IC, 2) prevent gate ringing, 3) dissipate power in the gate capacitor, and 4) help avoid parasitic turn-on of the transistor. As shown in FIG. 9, a small gate resistance $R_{G-min}$ is preferably employed to perform these other functions as well as helping to ensure that a minimum limit to the switching time is maintained. A trace 79 shows an example of a thermistor resistance $R_T$ according to a prior art embodiment which uses a thermistor to compensate for temperature-dependent changes of the inherent switching time of the transistor. Over almost the entire temperature range, the thermistor embodiment creates a total gate resistance greater than a minimum needed to limit peak current and perform the other functions mentioned above. The gate driver must be designed to generate gate drive signals of sufficient magnitude to work in tandem with these higher values of gate resistance. In the present invention, these higher gate resistances are avoided and the gate driver requirements are relaxed, which can lead to lower power requirements and less expensive components being used for the gate drivers.

Figure 10:
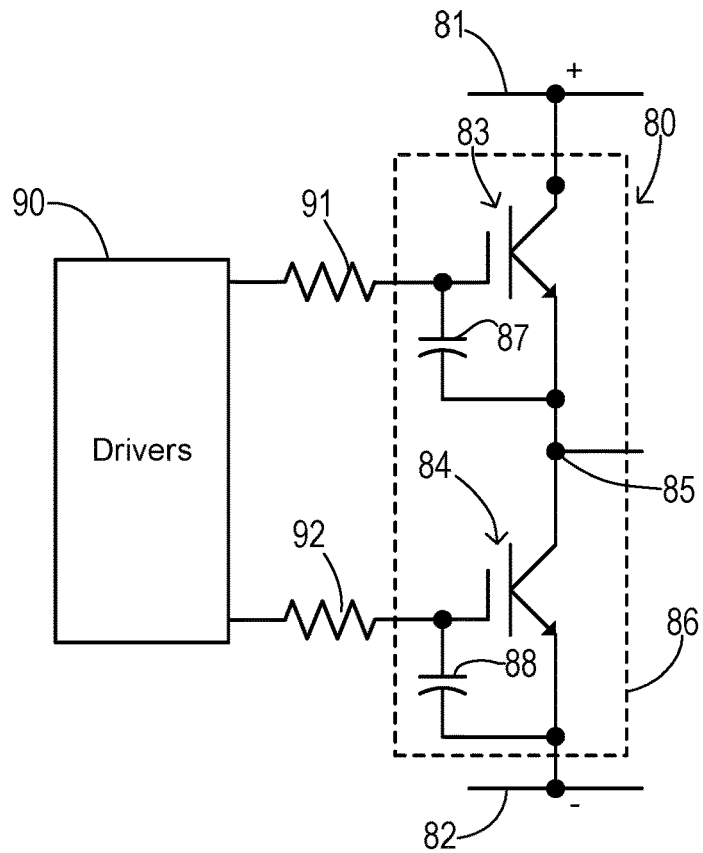
FIG. 10 is a schematic diagram showing an inverter phase leg incorporating an NTC capacitor of the present invention.

FIG. 10 shows the invention as utilized with power switching devices of an inverter phase leg. A phase leg 80 connected between a positive bus 81 and a negative bus 82 is comprised of IGBTs 83 and 84 connected in series with an intermediate junction 85 connected to a load (not shown). IGBTs 83 and 84 are fabricated as part of a power module or power card 86. NTC gate capacitors 87 and 88 connected to IGBTs 83 and 84 are mounted on power card 86 so that they are thermally coupled (i.e., the NTC capacitors are at the same temperature as the IGBTs). Gate drivers 90 are coupled to the respective gate terminals of IGBTs 83 and 84 by gate resistors 91 and 92. Drivers 90 receive switching commands from a PWM circuit and provide gate drive signals to the respective gate terminals to control the bridge output. Due to the negative temperature coefficient of gate capacitors 87 and 88, changes in the switching speed of IGBTs 83 and 84 that would inherently occur over a predetermined range of temperature are countered by the change in capacitance of gate capacitors 87 and 88 over the same temperature range. Gate resistors 91 and 92 provide a respective fixed resistance in series with each respective gate terminal. The fixed resistance is smaller than the level of resistance needed in the prior art since the resistors are no longer the main element being used to slow down the switching speed. At the lowest temperatures in the range, NTC capacitors 87 and 88 have their greatest capacitance, and primarily control the added delay in the switching time. At the highest temperatures in the range, then the capacitance of NTC capacitors 87 and 88 preferably drops to near zero. For the highest temperatures, the resistance of gate resistors 91 and 92 are preferably selected to provide the desired switching time. In addition, the resistance of gate resistors 91 and 92 is designed to be sufficient to perform other important functions including limiting peak gate current to protect the output stage of the driver IC, preventing gate ringing, dissipating power in the gate loop, and helping avoid parasitic turn on of the transistor.

What is claimed is:

1. An inverter for an electric vehicle drive, comprising:
a bridge including a plurality of power switching devices having respective insulated gate terminals and emitter terminals;
a PWM circuit determining switching commands for controlling the bridge;
a plurality of gate drivers receiving the switching commands and providing gate drive signals to respective gate terminals; and
a plurality of discrete gate capacitors each thermally coupled to a respective switching device and electrically connected between the respective gate and emitter terminals, wherein each gate capacitor has a negative temperature coefficient adapted to counter changes in a switching speed of the switching devices over a predetermined range of temperature.

2. The inverter of claim 1 wherein the switching devices are comprised of a plurality of power semiconductor dies, and wherein each gate capacitor is comprised of a surface-mount device which is mounted on a respective power semiconductor die having the respective switching device.

3. The inverter of claim 1 wherein the switching devices are comprised of a plurality of power semiconductor dies, and wherein each gate capacitor is comprised of a non-surface mount component connected to a respective switching device via jumper wires soldered to a respective power semiconductor die.

4. The inverter of claim 1 wherein the gate capacitors are comprised of ceramic capacitors.

5. The inverter of claim 4 wherein the ceramic capacitors are multi-layer ceramic capacitors.

6. The inverter of claim 1 further comprising a plurality of gate resistors each providing a respective fixed resistance in series with a respective gate terminal, wherein the fixed resistance is configured to provide a predetermined switching time when the gate capacitors are at a highest temperature in the predetermined range of temperature.

7. A power switching circuit for an inverter bridge, comprising:
   an insulated gate transistor with gate, collector, and emitter terminals and having a switching time varying over a predetermined range of temperature; and
   a discrete gate capacitor thermally coupled to the transistor and electrically connected between the gate and emitter terminals, wherein the gate capacitor has a negative temperature coefficient adapted to counter changes in the switching speed of the transistor over the predetermined range.

8. The circuit of claim 7 wherein the transistor is comprised of a power semiconductor die, and wherein the gate capacitor is comprised of a surface-mount device which is mounted on the power semiconductor die.

9. The circuit of claim 7 wherein the transistor is comprised of a power semiconductor die, and wherein the gate capacitor is comprised of a non-surface mount component connected to the transistor via jumper wires soldered to the power semiconductor die.

10. The circuit of claim 7 wherein the gate capacitor is comprised of a ceramic capacitor.

11. The circuit of claim 10 wherein the ceramic capacitor is a multi-layer ceramic capacitor.

12. The circuit of claim 7 further comprising a gate resistor providing a fixed resistance in series with the gate terminal, wherein the fixed resistance is configured to provide a predetermined switching time when the gate capacitor is at a highest temperature in the predetermined range of temperature.

* * * * *